United States Patent [19]

Aizawa

[11] Patent Number: 5,418,381
[45] Date of Patent: May 23, 1995

[54] PHOTOCOUPLED CIRCUIT WITH PHOTODIODE ARRAYS DRIVING A MOSFET SWITCH AND CURRENT LIMITING CIRCUIT

[75] Inventor: Yoshiaki Aizawa, Kanagawa, Japan

[73] Assignee: Kabushiki Kaisha Toshiba, Kanagawa, Japan

[21] Appl. No.: 214,694

[22] Filed: Mar. 18, 1994

[30] Foreign Application Priority Data

Mar. 19, 1993 [JP] Japan ................................. 5-059985

[51] Int. Cl.$^6$ ............................................. G02B 27/00
[52] U.S. Cl. ..................................... 250/551; 327/514
[58] Field of Search ........................... 250/551, 214 R; 307/311, 270, 254, 570

[56] References Cited

U.S. PATENT DOCUMENTS

| | | | |
|---|---|---|---|
| 4,390,790 | 6/1983 | Rodriguez | 250/551 |
| 4,647,794 | 3/1987 | Guajardo | 307/311 |
| 5,013,926 | 5/1991 | Aizawa | 250/551 |
| 5,146,100 | 9/1992 | Banaska | 250/551 |

OTHER PUBLICATIONS

"Optically Coupled Power Mosfet Technology: A Monolithic Replacement For Electromechanical Relays", Edward T. Rodriguez, Electro '83, Session Record 7/3, IEEE, pp. 1-9, 1983.

*Primary Examiner*—David C. Nelms
*Assistant Examiner*—Steven L. Nichols
*Attorney, Agent, or Firm*—Finnegan, Henderson, Farabow, Garrett & Dunner

[57] ABSTRACT

A photocoupler apparatus includes a light emitting diode, a first photodiode array which generates a first electromotive force by being activated with a light signal from the light emitting element, and an output MOSFET which is driven by the first electromotive force. This apparatus further includes a current limiting circuit and a second photodiode array which generates a second electromotive force by being activated with the light signal from the light emitting diode. The current limiting circuit controls the behavior of the MOSFET so as to limit an output current below a predetermined value. In addition, this circuit is driven by the second electromotive force generated by the second photodiode array. So, the whole resistance of this apparatus as a product can be greatly reduced and a photocoupler apparatus having a high current capacity can easily be obtained in this invention.

9 Claims, 7 Drawing Sheets

PHOTOCOUPLED CIRCUIT WITH PHOTODIODE ARRAYS DRIVING A MOSFET SWITCH AND CURRENT LIMITING CIRCUIT

BACKGROUND OF THE INVENTION

1. Field of the invention

This invention relates to a photocoupler apparatus having an output MOSFET at the secondary side in general, and more particularly, to the photocoupler apparatus which is capable of limiting the output current flowing through the conducting electrodes of the output MOSFET below a certain value.

2. Description of the prior art

In FIG. 1, the circuit structure of a photocoupler apparatus is shown according to one prior art of this invention. This apparatus is described in "Optically Coupled Power MOS FET Technology: A Monolithic Replacement For Electrome chemical Relays", Electro '83, Session Record 7/3, IEEE 1983.

As shown in FIG. 1, this photocoupler apparatus has a light emitting diode 1 at its primary side for emitting light when receiving input signals through terminals 6 and 6'. In the secondary side of this apparatus, there are provided a first photodiode array 2a, a discharging MOSFET 10b, a second photodiode array 10a, a first and a second output MOSFETs 5 and 5', a first and a second parasitic diodes 5a and 5a', a first and a second current detecting resistors 4 and 4', and a first and a second bipolar transistors 3a and 3a'. In this apparatus, first photodiode array 2a generates electromotive force when receiving a light signal from light emitting diode 1. On the other hand, the second photodiode array 10a drives discharging MOSFET 10b by receiving the light signal from light emitting diode 1. In addition, bipolar transistors 3a and 3a' operate as current limiting circuits.

In said apparatus, current detecting resistors 4 and 4' are connected in series with the conducting electrodes of first and second output MOSFETs 5 and 5'. The base-emittor junctions of bipolar transistors 3a and 3a' are biased by the voltage difference developed across resistor 4 or 4', thus controlling the gate-source voltages of the first and the second output MOSFETs. As a result, the current which flows through the conducting electrodes of MOSFETs 5 and 5' are limited below a certain value.

So, the output current flowing across terminals 7 and 7' are limited depending on the resistance values of current detecting resistors 4 and 4' and the base-emittor voltages VBE (that is, VF of base-emittor junction) of bipolar transistors 3a and 3a'. In usual, the VBE of bipolar transistors 3a and 3a' made of Si is about 0.5 V. Therefore, a voltage greater than 0.5 V should be developed across each resistor 4 and 4' in order to limit the output current.

Due to the above mentioned reason, the resistance of current detecting resistors 4 and 4' can't be reduced below a certain value which depends on the current value to limit. This fact increases not only on-resistance Ron of a final product (on-resistance of output MOSFETs 5 and 5' +values of resistors 4 and 4'), but its heat loss. As a result, the prior art photocoupler apparatus is disadvantageous in that the current capacity of this apparatus can't be made so large. In other words, the apparatus can't accept a large current.

SUMMARY OF THE INVENTION

This invention has been made to overcome the above mentioned problems of the prior art photocoupler apparatus.

Therefore, the objective of the present invention is to provide a photocoupler apparatus which is capable of reducing its on-resistance so as to realize a large current capacity of the final product.

In order to accomplish the above mentioned objective, the photocoupler apparatus of this invention has a circuit for limiting the output current of this apparatus below a predetermined value and a second photodiode array which works as an electric power source for this current limiting circuit.

In the first feature of the present invention, a photocoupler apparatus has the following as shown in FIG. 2: light emitting element 1; first photodiode array 2a for generating electromotive force on the reception of a light signal from light emitting element 1; output MOSFET 5 which is driven by the electromotive force generated by array 2a; current limiting circuit 8 for controlling the output current flowing through the conducting electrodes of MOSFET 5; and second photodiode array 2b which generates electromotive force on the reception of the light signal from element 1 and drives current limiting circuit 3 with this electromotive force.

In the second feature of the present invention, said photocoupler apparatus further has a current detecting resistor 4 whose one end is connected to the source of MOSFET 5. In addition, said current limiting circuit 3 is comprised of bipolar transistor 3a whose collector is connected to the gate of MOSFET 5, whose emittor is connected to another end of resistor 4, and whose base is connected to the junction of the source of MOSFET 5 and resistor 4 through second photodiode array 2b.

According to said first and second features, current detecting resistor 4 is connected in series with the conducting electrodes of output MOSFET 5 in order to limit the current flowing through the conducting electrodes of MOSFET below a certain value. The voltage difference developed across resistor 4 is enhanced by second photodiode array 2b and supplied to the base of bipolar transistor 3. In usual, more than 0.5 V is required to turn on bipolar transistor 8. This means that resistor 4 should have a resistance value so as to generate a voltage greater than 0.5 V with a current having a certain value to limit. In this invention, however, the voltage developed across resistor 4 is enhanced by second photodiode array 2b before it is supplied to the base of bipolar transistor 3. Accordingly, the required voltage to be developed across resistor 4 can be greatly reduced in this invention. Let VBF of bipolar transistor 8 be 0.5 V and the voltage generated by second photodiode array 2b be 0.4 V. In this case, the photocoupler apparatus of this invention requires 0.1 V to be developed across resistor 4. In the prior art apparatus, however, 0.5 V should be developed across resistor 4. Thus, this invention can greatly reduce the value of resistor 4 as compared with that of the prior art apparatus.

In general, the electric power supply, which is utilized to enhance the voltage developed across resistor 4, should be isolated. In some cases, a plurality of such power supplies, which are isolated to each other, are required. It is, therefore, very difficult in the prior art to obtain such power supplies from external circuits. On the contrary, it is very easy in this invention to realize such a power supply because second photodiode array 2b is a floated power supply.

In the third feature of the present invention, as shown in FIG. 3, second output MOSFET 5', second resistor 4', second current limiting circuit 3', and third photodiode array 2b are provided in addition to the structure shown in FIG. 2. The photocoupler apparatus having this feature is applicable to drive an ac load while a dc load is driven by the apparatus having the first and second features.

In the photocoupler apparatus shown in FIG. 3, first and second current limiting circuits 3 and 3' may be comprised of bipolar transistors 3a and 3a' as shown in FIG. 4. In addition, said two current limiting circuits 3 and 3' may be driven by the same photodiode array 2b as shown in FIG. 5. In this case, a photocoupler apparatus having a smaller size can be realized.

In the fourth feature of the present invention, as shown in FIG. 6, a third resistor 8 and a rectifier diode 9 are provided in addition to the structure shown in FIG. 5 to reduce the turn-off time of this apparatus.

In the fifth feature of the present invention, a differential amplifier Amp is provided as shown in FIG. 7 in order to detect the voltage differences developed across resistors 4 and 4'. Bipolar transistors 3a and 3a' (that is, current limiting circuits 3 and 3') are driven by being activated with these detected voltages. This amplifier can change the magnitude of said voltage into the form of sensitivity which may be improved easily by changing the circuit constants. Accordingly, by setting a high sensitivity in this amplifier, the values of resistors 4 and 4' can be reduced greatly. A fourth photodiode array 2b'' may be provided as an electric power supply for the amplifier. In this case, no external power supply is required.

These and other objectives, features, and advantages of the present invention will be more apparent from the following detailed description of preferred embodiments in conjunction with the accompanying drawings.

DETAILED DESCRIPTION OF PREFERRED EMBODIMENTS

Figure 2:
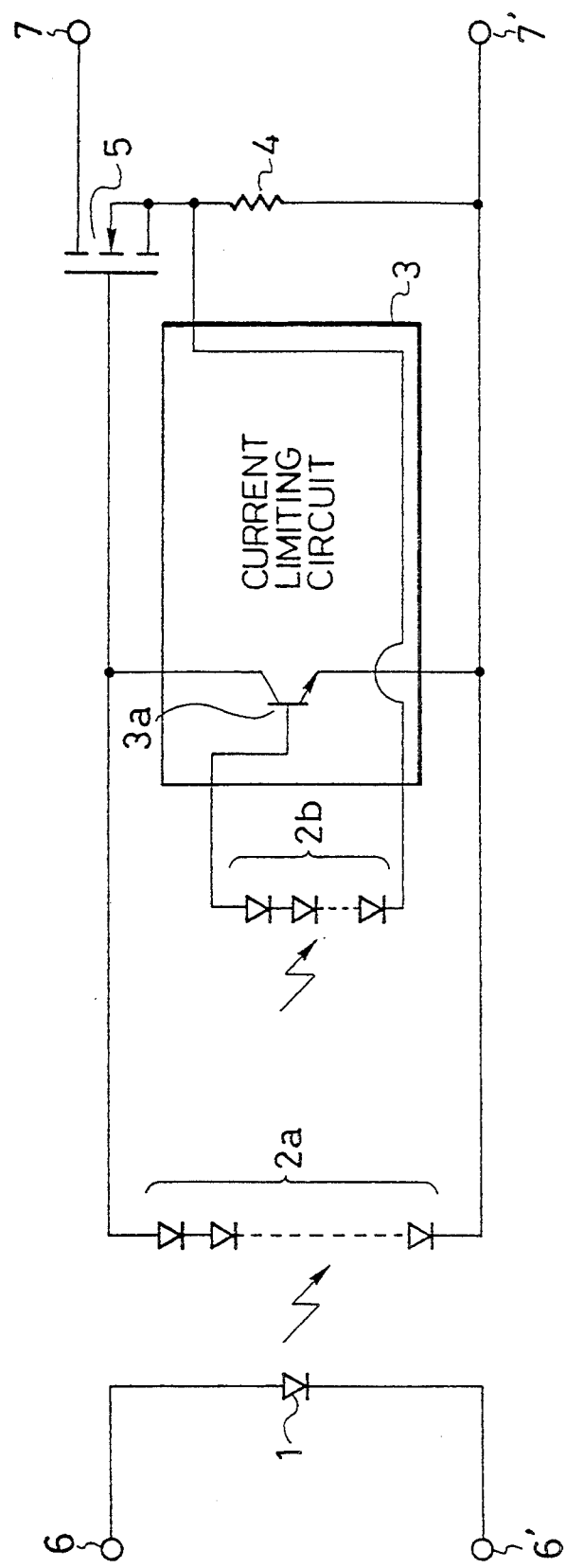
FIG. 2 is a circuit diagram showing the structure of a photocoupler apparatus according to the first embodiment of this invention.

FIG. 2 shows the circuit structure of a photocoupler apparatus according to the first embodiment of the present invention. As shown in this figure, the photocoupler apparatus is comprised of the following: a light emitting diode 1 for emitting light when activated by an input signal introduced through terminals 6 and 6'; a first photodiode array 2a for generating electromotive force by receiving a light signal from light emitting diode 1; an output MOSFET 5 which is driven by the electromotive force generated by first photodiode array 2a; a current limiting circuit 3 which controls the behavior of MOSFET 5 so as to limit the current flowing through the conducting electrodes of MOSFET 5 below a certain value; a current detecting resistor 4 whose one end is connected to the source of MOSFET 5; a second photodiode array 2b which generates electromotive force when receiving the light signal from light emitting diode 1 and drives current limiting circuit 3 with this electromotive force; and output terminals 7 and 7'.

In actuality, circuit 3 is comprised of a bipolar transistor 3a whose collector is connected to the gate of output MOSFET 5, whose emitter is connected to another end of current detecting resistor 4, and whose base is connected to the junction of resistor 4 and the source of MOSFET 5 through Photodiode array 2b.

According to the above mentioned structure, first photodiode array 2a generates electromotive force when activated with the light signal emitted by light emitting diode 1. Output MOSFET 5 is driven by this electromotive force. When a current in excess of a predetermined value flows across output terminals 7 and 7' while MOSFET 5 is in an on-state, current limiting circuit 3 (bipolar transistor) comes into an active state by being biased with the voltage difference developed across resistor 4. In this active state, circuit 3 works to control the gatesource voltage of MOSFET 5 and limit the current flowing across output terminals 7 and 7' below the predetermined value.

Consider a case to limit the output current below 150 mA as an example. Let VBE of bipolar transistor 3 be 0.5 V and the generated voltage by second photodiode array 2b be 0.4 V. Then, 0.1 V is required in this embodiment as the voltage developed across resistor 4, while 0.5 V is required in the prior art photocoupler apparatus (shown in FIG. 1) in which second photodiode array 2b is not included. Therefore, about $0.67\Omega$ (0.1 V/150 mA $\approx 0.67\Omega$) is needed for the value of resistor 4 in this embodiment, while about $3.33\Omega$ (0.5 V/150 mA $\approx 3.33\Omega$) is needed in the prior art. Accordingly, the value of resistor 4 is greatly reduced in this embodiment as compared with the prior art photocoupler apparatus.

In addition, second photodiode array 2b behaves as an electric source for improving the detecting sensitivity (the sensitivity for detecting the voltage difference developed across resistor 4) of current limiting circuit 3 (bipolar transistor). In general, the electric source for such use should be isolated from the rest elements of the circuit. Sometimes, a plurality of such electric sources isolated to each other are required. Due to these facts, it is almost impossible to obtain such electric sources from external circuits. In this embodiment, however, such an electric source can be obtained without any difficulty because second photodiode array 2b is floated.

Next, the second embodiment of this invention will be explained with referring to FIGS. 3 and 4.

Figure 3:
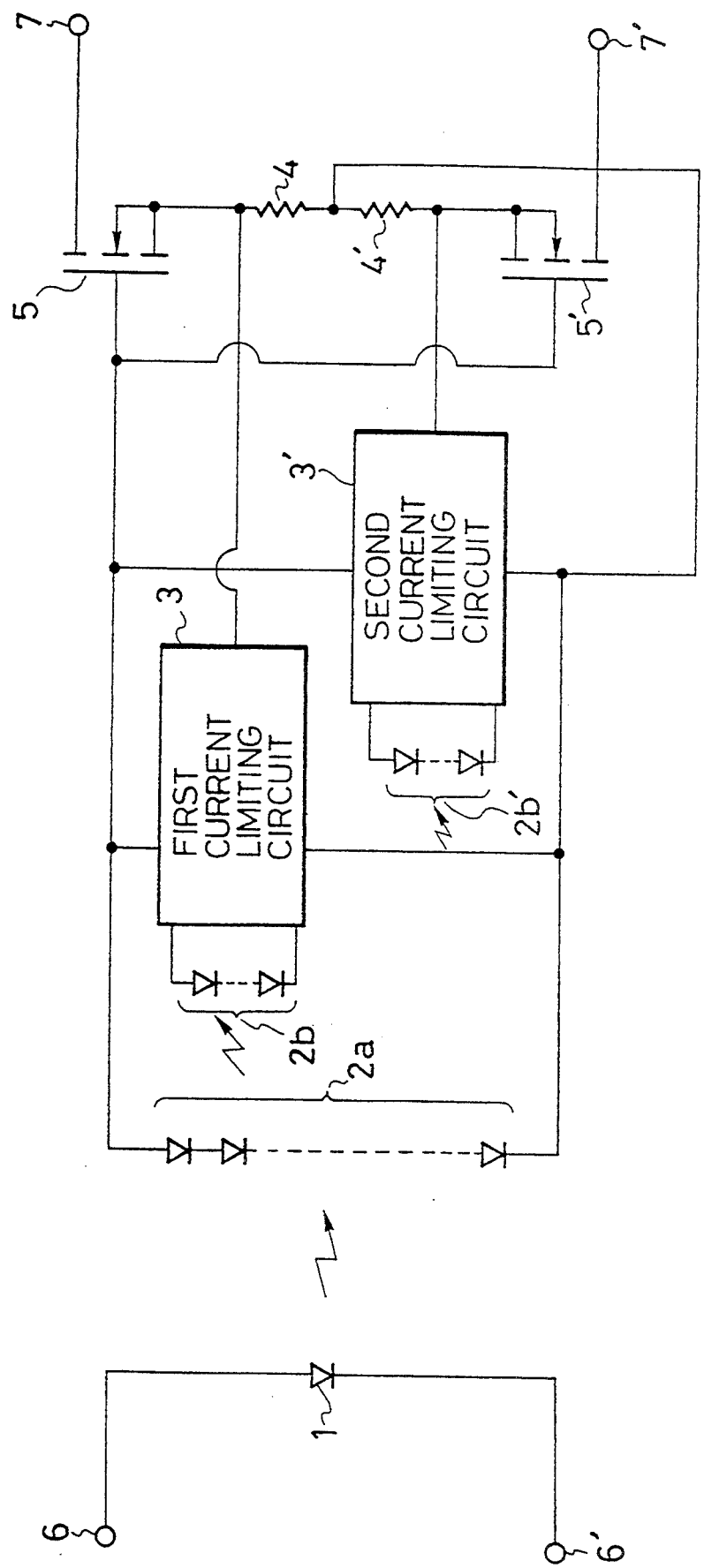
FIG. 3 is a circuit diagram showing the structure of a photocoupler apparatus according to the second embodiment of this invention.
Figure 4:
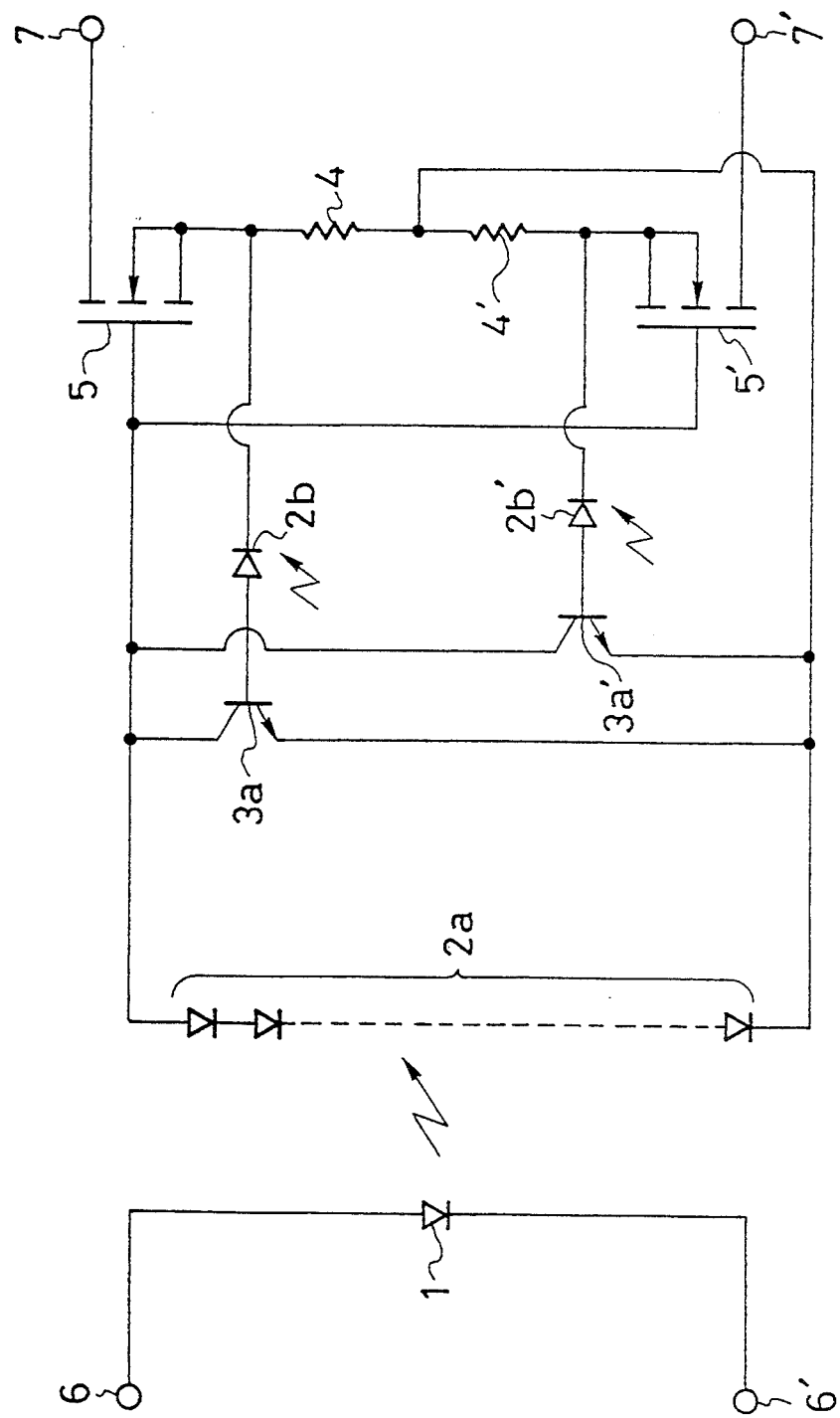
FIG. 4 is a circuit diagram showing the detailed structure of the photocoupler apparatus according to the second embodiment of this invention.

As shown in FIGS. 3 and 4, the photocoupler apparatus of this embodiment is comprised of the flowing: light emitting diode 1 for emitting a light signal when activated with an input signal; first photodiode array 2a for generating electromotive source when receiving the light signal from light emitting diode 1; first and second output MOSFETs 5 and 5' whose gate electrodes are shorted to each other; first and second current limiting circuits 3 and 3'; first and second current detecting resistors 4 and 4'; and second and third photodiode arrays 2b and 2b' for driving first and second current limiting circuits 3 and 3' respectively.

In the above mentioned structure, said first and second output MOSFETs 5 and 5' are driven by the electromotive force generated by the first photodiode array 2a. Said current limiting circuits 3 and 3' control said first and second MOSFETs 5 and 5' respectively and limit the output current flowing through their conducting electrodes below a certain value. In addition, each one end of said current detecting resistors 4 and 4' is connected to the respective source of MOSFETs 5 or 5', while the other ends are shorted to each other.

In said first embodiment, a dc load is driven between terminals 7 and 7'. On the contrary, the second embodiment has been made to drive an ac load between terminals 7 and 7'. Therefore, a pair of MOSFETs, current limiting circuits, current detecting resistors and photodiode arrays are provided in the photocoupler apparatus of this embodiment.

As shown in FIG. 4, first current limiting circuit 3 may be comprised of a first bipolar transistor 3a whose collector is connected to the gate of first output MOSFET 5, whose emitter is connected to the short junction of first and second resistors 4 and 4', and whose base is connected to the junction of the source of first MOSFET 5 and first resistor 4 through second photodiode array 2b. In the same manner, second current limiting circuit 3' may be comprised of a second bipolar transistor 3b whose collector is connected to the gate of second output MOSFET 5', whose emitter is connected to the short junction of first and second resistors 4 and 4', and whose base is connected to the Junction of the source of second MOSFET 5' and second resistor 4' through third photodiode array 2b'.

In this embodiment, first photodiode array 2a generates electromotive force when activated with the light signal from light emitting diode 1 and drives first and second output MOSFETs 5 and 5' with this electromotive force. The operation of this photocoupler apparatus will be explained next with respect to the case where a current flows from first output terminal 7 to second output terminal 7'.

When a current in excess of a predetermined value flows between terminals 7 and 7', a voltage difference arises across resistor 4. This voltage is enhanced by photodiode array 2b and the base-emitter junction of bipolar transistor 3a are biased with the voltage thus enhanced. Then, bipolar transistor 3a comes into an on-state, allowing the current generated by first photodiode array 2a to flow through transistor 3a. This drops the gate voltage of first and second output MOSFETs 5 and 5'. As a result, the on-resistances of MOSFETs 5 and 5' increase to cause the reduction of the output current, thus controlling the output current to be under the predetermined value.

The current controlling procedure in the case where the output current flows from terminal 7' to terminal 7 is analogous to the above mentioned case.

As explained above, this embodiment utilizes second and third photodiode arrays 2b and 2b' to be the electric power sources for first and second current limiting circuits 3 and 3' (bipolar transistors 3a and 3a') in order to improve their detecting sensitivity. As a result, the values of current detecting resistors 4 and 4' can be greatly reduced in this embodiment.

Next, the third embodiment of this invention will be explained with referring to FIG. 5.

The photocoupler apparatus of the third embodiment differs from the second embodiment in that the third embodiment utilizes second photodiode array 2b as the common electric source for first and second current limiting circuits 3 and 3'.

Figure 5:
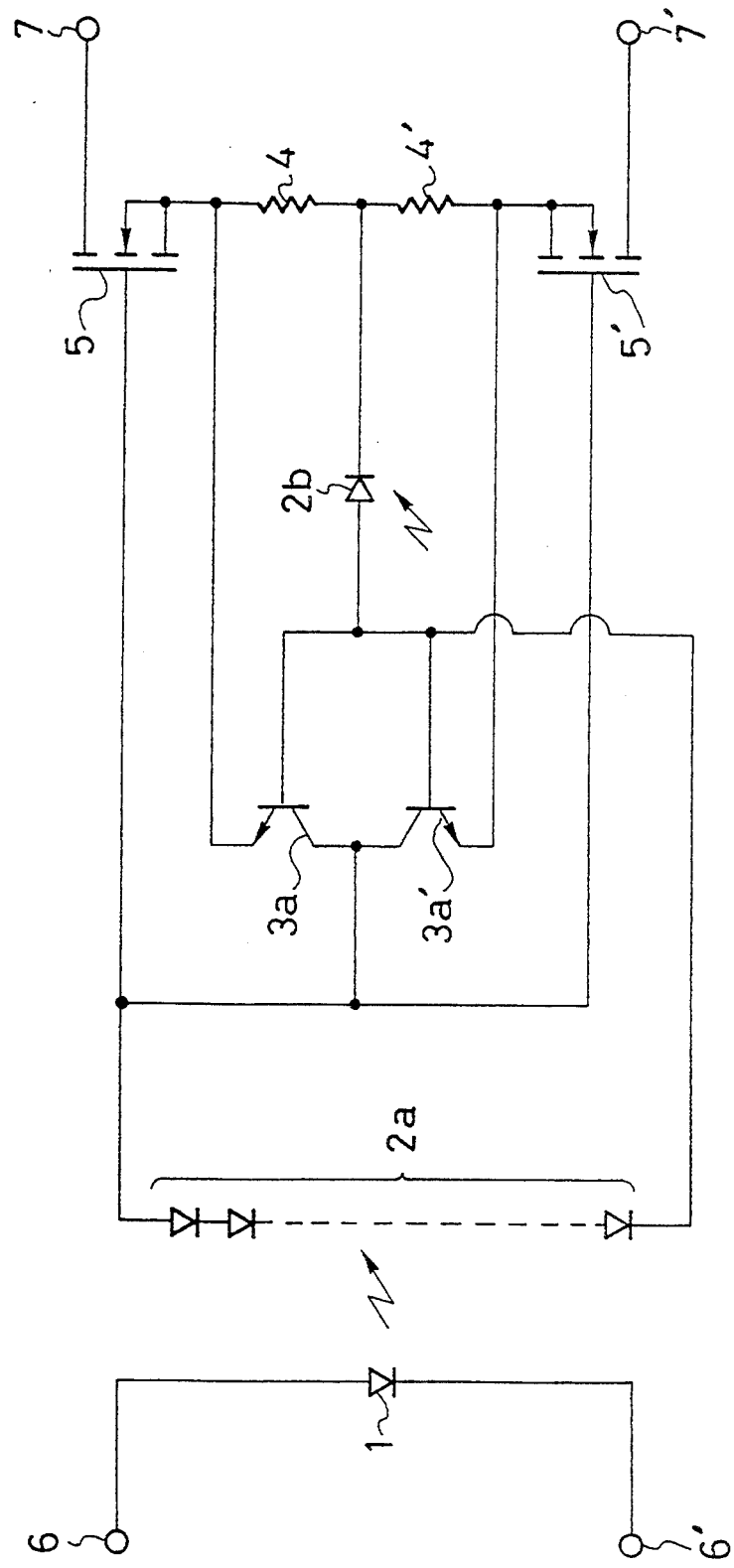
FIG. 5 is a circuit diagram showing the structure of a photocoupler apparatus according to the third embodiment of this invention.

As shown in FIG. 5, first current limiting circuit 3 (bipolar transistor 3a) is connected to first output MOSFET 5 in the following manner: its collector is connected to the gate of first output MOSFET 5; its emittor is connected to the junction of first output MOSFET 5 and first current detecting resistor 4; and its base is connected to the short junction of first and second current detecting resistors 4 and 4' through second photodiode array 2b. In the similar manner, second current limiting circuit 3' (bipolar transistor 3a') is connected to second output MOSFET 5' in the following manner: its collector is connected to the gate of second output MOSFET 5'; its emitter is connected to the junction of second output MOSFET 5' and second current detecting resistor 4'; and its base is connected to the short junction of first and second current detecting resistors 4 and 4' through second photodiode array 2b.

The current controlling mechanism of this embodiment will be explained next with respect to the case where the output current flows from terminal 7 to terminal 7'.

When a current in excess of a predetermined value flows between terminals 7 and 7', a voltage difference is developed across current detecting resistor 4'. This voltage is enhanced by second photodiode array 2b and the base-emitter junction of transistor 3a' is biased with the voltage thus enhanced. As a result, transistor 3a' turns on to bypass the current generated by first photodiode array 2a. The gate voltage of first and second output MOSFETs 5 and 5' decreases due the turn-on of transistor 3a'. Thus, the on-resistances of MOSFETs 5 and 5' are controlled so as to limit the output current below the predetermined value. The current controlling mechanism of the case where the output current flows from terminal 7' to terminal 7 is analogous to said case.

As explained above, this embodiment utilizes second photodiode array 2b as an electric source for first and second current limiting circuits 3 and 3' (bipolar transistors 3a and 3a') in order to improve their current detecting sensitivity. Therefore, this embodiment can greatly reduce the resistance values of current detecting resistors 4 and 4'. In addition, this embodiment can save the chip area of this photocoupler apparatus because first and second current limiting circuits 3 and 3' (bipolar transistors 3a and 3a') are commonly driven with second photodiode array 2b.

Next, the fourth embodiment of this invention will be explained with referring to FIG. 6.

In addition to the structure of the photocoupler apparatus according to the third embodiment, the photocoupler apparatus of this embodiment further includes a third resistor 8, which is inserted between the respective bases and collectors of first and second bipolar transistors 3a and 3a', and a rectifier diode 9 which is inserted between second photodiode array 2b and the short junction of first and second resistors 4 and 4'. As shown in FIG. 6, rectifier diode 9 is connected in series-opposition to second photodiode array 2b.

First and second bipolar transistors 3a and 3a' of this embodiment are utilized in order to discharge the gate and source capacitors of first and second output MOSFETs 5 and 5' once the output current has turned off.

The current controlling mechanism in this embodiment will be explained next with respect to the case where a current flows from terminal 7 to terminal 7'.

When a current in excess of a predetermined value flows between terminals 7 and 7', a voltage difference arises across current detecting resistor 4'. Although this voltage is reduced by VF of rectifier diode 9, it is further enhanced by second photodiode array 2b and biases the base-emittor junction of bipolar transistor 3a' to turn on. This allows the current generated by first photodiode array 2b to flow through transistor 3a'. At the same time, a small current flows through resistor 8. This current can, however, be ignored so far as resistor 8 has a large value of resistance. As a result, the gate voltage of first and second output MOSFETs 5 and 5' decreases and therefore, their on-resistances Ron increase. Thus, the output current is controlled to be under the predetermined value. The current controlling procedure of the case where an output current flows from terminal 7 to terminal 7' is analogous to said case.

Next, the discharge mechanism of first and second output MOSFETs 5 and 5' will be explained once the output current has turned off.

Once first photodiode array 2b has stopped generating the electromotive force, a part of positive charges stored at the gates of first and second output MOSFETs 5 and 5' flow into the base electrodes of bipolar transistors 3a and 3a' through resistor 8. At this time, in order not to negatively bias the base electrodes of bipolar transistors 3a and 3a' with the negative charges stored in the source electrodes of first and second output MOSFETs 5 and 5', rectifier diode 9 electrically separates the base electrodes of bipolar transistors 3a and 8a' from the source electrodes of first and second output MOSFETs 5 and 5' respectively. As a result, a part of positive charges, which has flowed into their base electrodes from the gate electrodes of first and second output MOSFETs 5 and 5', make bipolar transistors 3a and 3a' to turn on, thus permitting first and second output MOSFETs 5 and 5' to discharge the electric charges stored in their gates and sources. Then, output terminals 7 and 7' come into an off state.

As explained above, at a turnoff of this apparatus, a part of stored charges in the respective gates and sources of MOSFETs 5 and 5' flow into the respective bases of bipolar transistors 3a and 3a'. As a result, a discharging current having current amplification factor hFE is generated between the respective collectors and emittors of bipolar transistors 3a and 3a'. The gate-source charges of first and second MOSFETs 5 and 5' are thus discharged quickly to realize a high speed turn-off of the output current.

Figure 1:
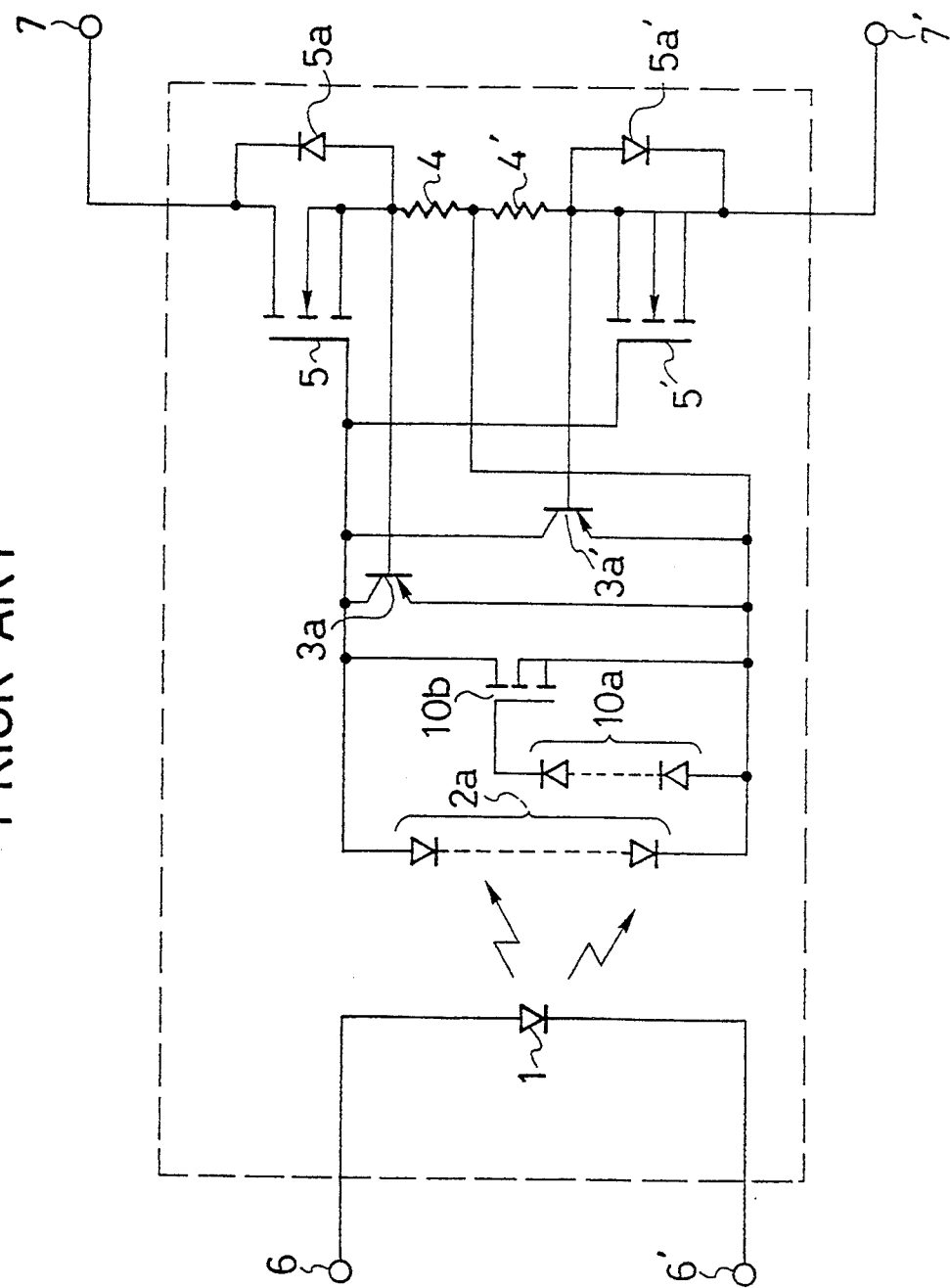
FIG. 1 is a circuit diagram showing the structure of a prior art photocoupler apparatus.

This embodiment utilizes second photodiode array 2b as an electric source for first and second current limiting circuits 3 and 3' (bipolar transistors 3a and 3a') in order to improve their detecting sensitivity. Therefore, this embodiment can greatly reduce the resistance value of current detecting resistors 4 and 4'. In addition, this embodiment can shorten the turnoff time of this apparatus without providing an additional circuit for discharging the gate and source electrodes of first and second output MOSFETs 5 and 5'. On the other hand, the prior art apparatus has photodiode array 10a and FET 10b so as to make up a discharging circuit for the gate and source electrodes of MOSFETs 5 and 5' as shown in FIG. 1.

Next, the fifth embodiment of this invention will be described with referring to FIG. 7.

In addition to the structure of the second embodiment, the photocoupler apparatus of this embodiment further has a differential amplifier Amp and a fourth photodiode array 2b". In this structure, fourth photodiode array 2b" generates electromotive force to drive differential amplifier Amp when receiving the light signal from light emitting diode 1. Differential amplifier Amp detects the voltage difference developed across first and second current detecting resistors 4 and 4' and supplies first and second current limiting circuits 3 and 3' of electric signals to drive these circuits.

Figure 7:
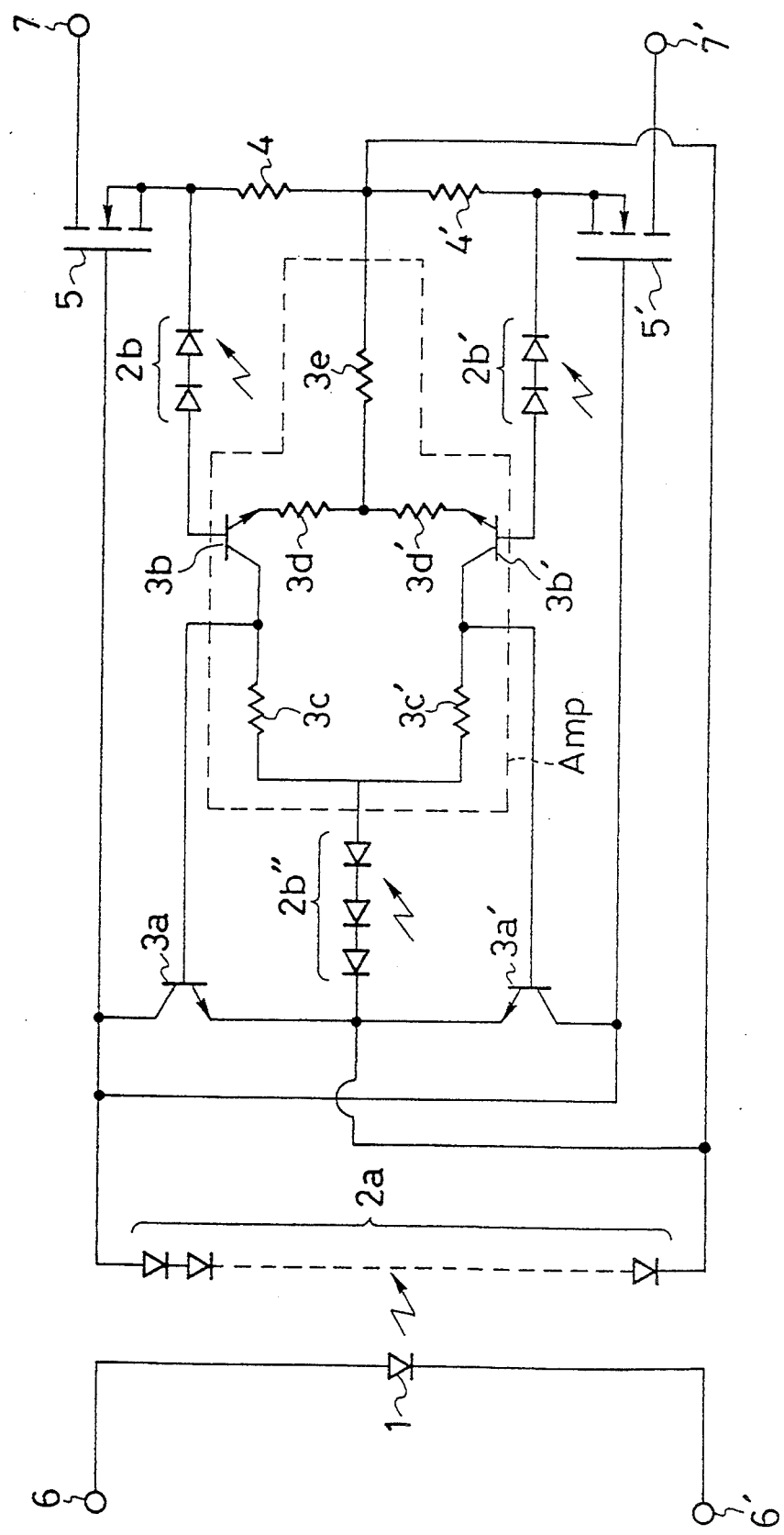
FIG. 7 is a circuit diagram showing the structure of a photocoupler apparatus according to the fifth embodiment of this invention.

As shown in FIG. 7, differential amplifier Amp is comprised of resistors 3c, 3c', 3d, and 3d', bipolar transistors 3b and 3b', and a current reducing resistor 3e.

In this embodiment, the voltage difference developed across resistors 4 and 4' is detected by differential amplifier Amp. The detecting sensitivity of this voltage difference can be easily arranged by changing the circuit constants of amplifier Amp. The sensitivity may be improved in order to reduce the resistance values of current detecting resistors 4a and 4a'.

The current controlling mechanism of this embodiment will be described below with respect to the case where an output current flows from output terminal 7 to output terminal 7'.

Once a current in excess of a predetermined value has flowed across output terminals 7 and 7', a voltage difference arises across current detecting resistors 4 and 4'. This voltage difference induces another voltage difference between the respective sources of first and second output MOSFETs 5 and 5'. The voltage difference between MOSFETs 5 and 5' is then raised by second and third photodiode arrays 2b and 2b' so as to bias the bases of bipolar transistors 3b and 3b', i.e., the input of differential amplifier Amp.

In this case, the base of bipolar transistor 3b is biased higher than that of bipolar transistor 3b'. Therefore, a certain difference arises between the operating conditions of bipolar transistors 3b and 3b', thus increasing the collector voltage of bipolar transistor 3b' and therefore, biasing its base emittor junction. As a result, bipolar transistor 3a' comes into an on-state, allowing the current generated by first photodiode array 2a to bypass. Due to this current bypass, the gate voltages of first and second output MOSFETs 5 and 5' decrease and the on-resistances of first and second MOSFETs 5 and 5' increase to limit the output currents.

The current controlling procedure of the case where the output current flows from terminal 7' to terminal 7 is analogous to the above mentioned case.

As explained above, the apparatus of this embodiment can reduce tile values of resistors 4 and 4' as much as possible for a practical use by properly arranging the detecting sensitivity of differential amplifier Amp. In addition, fourth photo-diode array 2b" in this embodiment works as an electric source for differential amplifier Amp so that no external power source should be provided.

In summary, the apparatus of this invention has a current detecting resistor which is connected in series with the conducting electrodes of an output MOSFET in order to limit the current flowing through said conducting electrodes below a predetermined value. The voltage difference developed across said resistor is enhanced by a second photodiode array and supplied to the base emittor junction of a bipolar transistor which works as a current limiting circuit. Therefore, this invention can greatly reduce the value of the resistor which is to limit the current flowing through the conducting electrodes of the output MOSFET below the predetermined value. So, this invention can provide a photocoupler apparatus which has a low on-resistance and therefore, a high current capacity.

In addition, the first and the second current limiting circuits may be driven in common with the second photodiode array. In this case, a photocoupler apparatus having a smaller size can be realized.

Figure 6:
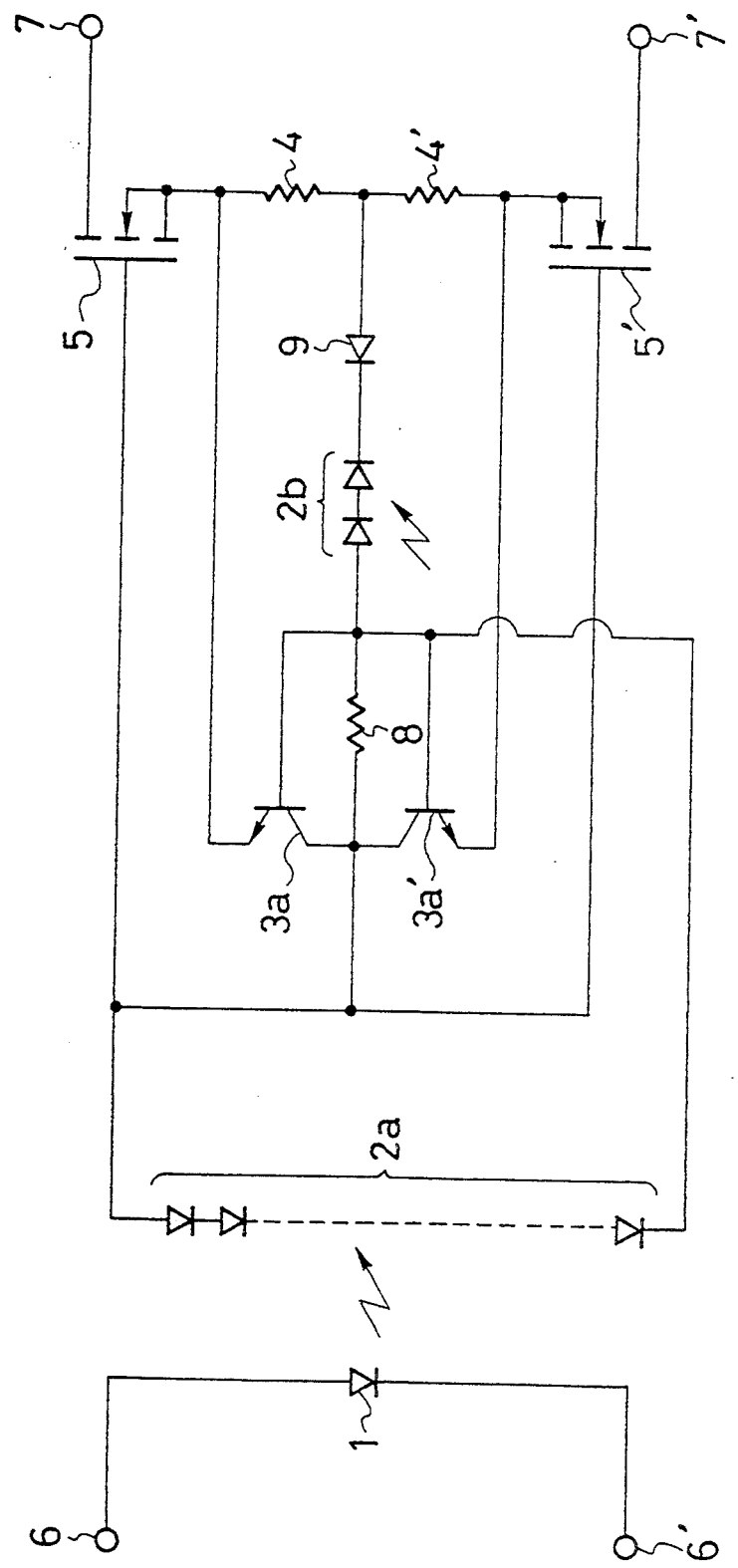
FIG. 6 is a circuit diagram showing the structure of a photocoupler apparatus according to the fourth embodiment of this invention.

Still in addition, by providing third resistor 8 and rectifier diode 9 as shown in FIG. 6, the first and the second bipolar transistors may function as circuits for discharging the gate-source capacity of the first and the second output MOSFETs once the output of this apparatus has turned off. Therefore, a photocoupler apparatus, which is able to turn off its output in a high speed, can be realized.

Still, in addition, by providing a differential amplifier as shown in FIG. 7, the voltage difference developed across the first and the second resistors may be determined as a sensitivity of this amplifier. This sensitivity may be easily arranged by changing the circuit constants. Therefore, in order to reduce the values of the resistors as much as possible for a practical use, the sensitivity of the amplifier may be optimized. This amplifier is driven by the fourth photodiode array so that no external electric power source is required.

What is claimed is:

1. A photocoupler apparatus, comprising:
 a light emitting element for emitting a light signal when activated by an input signal;
 a first photodiode array for generating electromotive force when receiving said light signal from said light emitting element;
 an output MOSFET which is driven by said electromotive force generated by said first photodiode array;
 a current limiting circuit for controlling the behavior of said output MOSFET so as to limit a current flowing through conducting electrodes of said MOSFET below a predetermined value; and
 a second photodiode array which generates second electromotive force by being activated with said light signal from said light emitting element and drives said current limiting circuit with said second electromotive force.

2. The photocoupler apparatus as claimed in claim 1, further comprising a current detecting resistor whose one end is connected to the source of said output MOSFET and said current limiting circuit, and whose another end is connected to one end of said first photodiode array.

3. The photocoupler apparatus as claimed in claim 2, wherein said current limiting circuit is comprised of a bipolar transistor whose collector is connected to the gate of said output MOSFET, whose emitter is connected to another end of said current detecting resistor, and whose base is connected to the junction of the source of said output MOSFET and said current detecting resistor through said second photodiode array.

4. A photocoupler apparatus, comprising:
 a light emitting element for emitting a light signal when activated by an input signal;
 a first photodiode array for generating electromotive force when receiving said light signal from said light emitting element;
 a first and a second output MOSFET which are connected to each other so as to short the respective gates and driven by said electromotive force generated by said first photodiode array;
 a first and a second current limiting circuit, each of which controls the behavior of said respective output MOSFET so as to limit a current flowing through conducting electrodes of said respective output MOSFET below a predetermined value; and
 a second and a third photodiode array which generates electromotive force by being activated with said light signal from said light emitting element and drive said first and second current limiting circuits respectively with said electromotive force.

5. The photocoupler apparatus as claimed in claim 4, further comprising a first and a second current detecting resistor connected to said first and second current limiting circuits respectively at one end of said first and second current limiting circuits and connected to said first photodiode array respectively at the other end of said first and second current limiting circuits.

6. The photocoupler apparatus as claimed in claim 5, wherein
 said first current limiting circuit is comprised of a first bipolar transistor whose collector is connected to the gate of said first output MOSFET, whose emitter is connected to the junction of one end of said first photodiode array and another end of said first current detecting resistor, and whose base is connected to the junction of the source of said first output MOSFET and said first current detecting resistor through said second photodiode array; and
 said second current limiting circuit is comprised of a second bipolar transistor whose collector is connected to the gate of said second output MOSFET, whose emitter is connected to the junction of one end of said first photodiode array and another end of said first current detecting resistor, and whose base is connected to the junction of the source of said second output MOSFET and said second current detecting resistor through said third photodiode array.

7. The photocoupler apparatus as claimed in claims 5 or 6, further comprising:
 a differential amplifier which detects the voltage difference arising across said first and second current detecting resistors and supplies said first and second current limiting circuits with driving signals which correspond to said voltage difference; and
 a third photodiode array which generates a third electromotive force by being activated with said light signal from said light emitting element and drives said differential amplifier with said third electromotive force.

8. A photocoupler apparatus, comprising:
 a light emitting element for emitting a light signal when activated by an input signal;
 a first photodiode array for generating electromotive force when receiving said light signal from said light emitting element;
 a first and a second output MOSFET which are connected to each other so as to short the respective gates and driven by said electromotive force generated by said first photodiode array;

a first and a second current detecting resistor connected to the respective sources of said first and second output MOSFETs at one end of said first and second current detecting resistors and connected to one end of a second photodiode array respectively at the other end of said first and second current detecting resistors;

a first bipolar transistor whose collector is connected to the gate of said first output MOSFET, whose emitter is connected to the junction of the source of said first output MOSFET and said first current detecting resistor, and whose base is connected to the other end of said second photodiode array described later;

a second bipolar transistor whose collector is connected to the gate of said second output MOSFET, whose emitter is connected to the junction of the source of said second output MOSFET and said second current detecting resistor, and whose base is connected to the other end of said second photodiode array; and said second photodiode array which is inserted between the short junction of said first and second current detecting resistors and the respective bases of said first and second bipolar transistors.

9. The photocoupler apparatus as claimed in claim 8, further comprising:

a third resistor connected to the respective base of said first and second bipolar transistors at one end of said third resistor and the respective collectors of said first and second bipolar transistors at the other end of said third resistor; and a rectifier diode which is inserted between said second photodiode array and the short junction of said first and second current detecting resistors, said rectifier being connected in series-opposition to said second photodiode array.

* * * * *